United States Patent [19]
Oga

[11] Patent Number: 5,986,506
[45] Date of Patent: Nov. 16, 1999

[54] SEMICONDUCTOR MICROWAVE AMPLIFIER

[75] Inventor: Toshiyuki Oga, Tokyo, Japan

[73] Assignee: NEC Corporation, Japan

[21] Appl. No.: 09/069,414

[22] Filed: Apr. 29, 1998

[30] Foreign Application Priority Data

May 2, 1997 [JP] Japan ..................... 9-114627

[51] Int. Cl.⁶ ............................................. H03F 3/60
[52] U.S. Cl. ................................... 330/286; 330/66
[58] Field of Search .................... 330/286, 65, 66, 330/67, 68, 53, 307

[56] References Cited

U.S. PATENT DOCUMENTS 3,869,678  3/1975  Mahoney ................................ 330/53
4,887,049  12/1989  Krowne ................................. 330/286

FOREIGN PATENT DOCUMENTS 56-27211  12/1988  Japan .
6318814  8/1989  Japan .

*Primary Examiner*—Benny Lee
*Assistant Examiner*—Henry Choe
*Attorney, Agent, or Firm*—Ostrolenk, Faber, Gerb & Soffen, LLP

[57] ABSTRACT

A semiconductor microwave amplifier includes input- and output-side microstrip lines formed on a printed-circuit board to oppose each other, input and output electrodes formed on the microstrip lines to be parallel to the microstrip lines, a pair of ground electrodes formed in a direction perpendicular to the input and output electrodes to oppose each other, and a semiconductor amplification device connected to all of the electrodes. This amplifier further has a metal plate connected to the ground electrodes to ensure high-frequency isolation between the input electrode and the output electrode and shield electromagnetic connection, and a through hole for connecting a ground portion of the semiconductor device to a ground surface for the microstrip lines, the ground surface being formed on the printed-circuit board.

7 Claims, 2 Drawing Sheets

SEMICONDUCTOR MICROWAVE AMPLIFIER

BACKGROUND OF THE INVENTION

1. Field of the Invention

The present invention relates to a semiconductor microwave amplifier based on a microstrip line mainly using a surface-mounted semiconductor amplification device for which automatic mounting or reflow is easy to perform.

2. Description of Prior Art

Conventionally, since a semiconductor microwave amplifier of this type uses a small semiconductor amplification device, the input and output electrodes of the semiconductor amplification device are close to each other, so high-frequency isolation can hardly be obtained. Consequently, the deviation in frequency characteristics of the gain increases, and additionally, little output power is obtained, or the output power is positively fed back to the input to easily cause oscillation.

Techniques for solving these problems have been developed. In a microwave semiconductor device disclosed in Japanese Examined Patent Publication No. 63-63121 (Japanese Unexamined Patent Publication No. 57-141944), the semiconductor amplification device is covered with a metal member having an opening with a predetermined shape, thereby obtaining desired isolation.

In a microwave amplifier disclosed in Japanese Unexamined Utility Model Publication No. 1-122618, a surface-mounted field effect transistor is used as the amplification device to form a microstrip high-frequency amplification circuit. In this microwave amplifier, the source electrode is grounded using a through hole. However, since the through hole has an inductance, the return loss degrades, the gain decreases, and oscillation or a decrease in output power due to positive feedback occurs. To prevent these disadvantages, the inductance of the through hole must be lowered. For this purpose, a large-sized through hole is used, and it is formed as close as possible to the source electrode to decrease the excess distribution constant between the source electrode and the ground surface. This measure also provides an effect for connection between the ground electrode and the ground surface in use of a semiconductor amplification device other than the field effect transistor.

This measure is effective for the above-described microwave semiconductor device disclosed in Japanese Examined Patent Publication No. 63-63121 as far as the semiconductor amplification device allows direct mounting on the ground surface. However, in use of a semiconductor amplification device to be surface-mounted on a printed-circuit board, when the semiconductor amplification device is to be covered with a metal member, the structure becomes complex because the printed circuit board must be subjected to special working such as hole formation for metal member attachment or connection for obtaining the ground surface. Additionally, in forming a microstrip amplification circuit, the metal member must be connected to the ground electrode at a low impedance. However, this process is difficult to perform for the surface-mounted semiconductor amplification device because of its shape.

In the microwave semiconductor device disclosed in Japanese Examined Patent Publication No. 63-63121, the holes formed in the printed-circuit board degrades isolation. Therefore, if high-frequency isolation is required between the upper and lower surfaces of the printed-circuit board, and an internal layer ground surface is formed, the ground surface for the microstrip line is formed in the multilayered printed-circuit board, so the above measure cannot be applied.

Furthermore, in the microwave semiconductor device disclosed in Japanese Examined Patent Publication No. 63-63121, a general automatic mounting machine for surface-mounted components performs only two-dimensional component mounting and does not cope with such three-dimensional assembly. For this reason, surface-mounted components can hardly be automatically mounted.

In the microwave amplifier disclosed in Japanese Unexamined Utility Model Publication No. 1-1226181, a large through hole must be formed near the ground electrode to decrease the impedance. However, if device soldering is performed using reflow, the solder flows into the through hole. A solder necessary for fixing the ground electrode may also flow into the through hole, resulting in degradation in soldering of the ground electrode. For this reason, the connection impedance between the ground electrode of the semiconductor amplification device and the ground surface for the microstrip line can hardly be lowered because of the structure.

SUMMARY OF THE INVENTION

The present invention has been made in consideration of the above situation of the prior art, and has as its object to provide a semiconductor microwave amplifier which has a low connection impedance between the ground electrode and the ground surface of the semiconductor amplification device, high isolation between the input and output and between the upper and lower surfaces of a printed-circuit board in mounting on a multilayered printed-circuit board, and a simple structure allowing use of an automatic mounting machine.

In order to achieve the above object, according to the first aspect of the present invention, there is provided a semiconductor microwave amplifier comprising input- and output-side microstrip lines formed on a printed-circuit board to oppose each other, input and output electrodes formed on the microstrip lines to be parallel to the microstrip lines, a pair of ground electrodes formed in a direction perpendicular to the input and output electrodes to oppose each other, and a semiconductor amplification device connected to all of the electrodes, comprising electromagnetic connection shielding means, connected to the ground electrodes, for ensuring high-frequency isolation between the input electrode and the output electrode to shield electromagnetic connection, and ground connection means for connecting a ground portion of the semiconductor device to a ground surface for the microstrip lines, the ground surface being formed on the printed-circuit board.

According to the second aspect of the present invention, the ground connection means in the first aspect has a through hole formation portion in the printed-circuit board.

According to the third aspect of the present invention, the electromagnetic connection shielding means in the first aspect has a portion inserted into a through hole formed at the through hole formation portion of the printed-circuit board and serving as solder flow prevention means for preventing a solder from flowing into the through hole.

According to the fourth aspect of the present invention, the electromagnetic connection shielding means in the first aspect has a flat portion serving as target chuck means in mounting using an automatic mounting machine.

According to the fifth aspect of the present invention, the electromagnetic connection shielding means in the first aspect is arranged on a side of the output electrode.

According to the sixth aspect of the present invention, the electromagnetic connection shielding means in the first aspect is arranged on a side of the input electrode.

According to the seventh aspect of the present invention, the printed-circuit board in the first aspect has a multilayered structure and has an internal layer set surface for the input- and output-side microstrip lines.

As is apparent from the above aspects, the semiconductor microwave amplifier of the present invention has a metal plate as the electromagnetic connection shielding means for shielding electromagnetic connection between the input and output electrodes of the semiconductor amplification device, and a through hole as the connection means for connecting the ground electrode of the semiconductor amplification device to the ground surface for the microstrip lines. The semiconductor microwave amplifier also has a portion serving as the flow prevention means at which the metal plate is inserted into the through hole to prevent the solder from flowing into the through hole in reflow, and a portion serving as the target chuck means to be chucked by the automatic mounting machine in mounting using the automatic mounting machine. For this reason, the connection impedance between the ground electrode of the semiconductor amplification device and the ground surface becomes low. In addition, isolation can be highly ensured between the input and the output or between the upper and lower surfaces of the printed-circuit board in mounting on a multilayered printed-circuit board. Furthermore, since the structure is simple, easy assembly is enabled using an automatic mounting machine.

More specifically, in this semiconductor microwave amplifier, the metal plate serving as the electromagnetic connection shielding means connected to the ground electrode is placed between the input electrode and the output electrode of the semiconductor amplification device to shield electromagnetic connection. With this structure, since the isolation between the input and the output can be improved, the deviation in frequency characteristics of the gain is reduced. Sufficient output power can be obtained, and oscillation generated upon positively feeding back the output power to the input can also be prevented.

The through hole for connecting the ground electrode of the semiconductor amplification device to the ground surface for the microstrip lines is closed. With this structure, even when a large through hole is used, the solder is prevented from flowing into the through hole to cause a soldering failure for the ground electrode of the semiconductor amplification device. For this reason, the ground electrode of a surface-mounted semiconductor amplification device to be attached by reflow can be connected to the ground surface for the microstrip lines at a low impedance. Therefore, the degradation in return loss, the decrease in gain, oscillation due to positive feedback, or the decrease in output power can be prevented.

In addition, since all components can be mounted from the upper surface side of the printed-circuit board, the semiconductor microwave amplifier can be easily assembled using a general automatic mounting machine allowing two-dimensional component mounting.

Furthermore, when the ground surface for the microstrip lines is formed in a multilayered printed-circuit board, the internal layer ground surface has an isolation effect between the upper and lower surfaces of the printed-circuit board, so isolation between the upper and lower surfaces of the multilayered printed-circuit board can be ensured. For this reason, the component mounting density can be increased.

The above and many other objects, features and advantages of the present invention will become manifest to those skilled in the art upon making reference to the following detailed description and accompanying drawings in which preferred embodiments incorporating the principles of the present invention are shown by way of illustrative example.

DETAILED DESCRIPTION OF PREFERRED EMBODIMENTS

A few preferred embodiments of the semiconductor microwave amplifier of the present invention will be described below in detail with reference to the accompanying drawings.

Figure 1A:
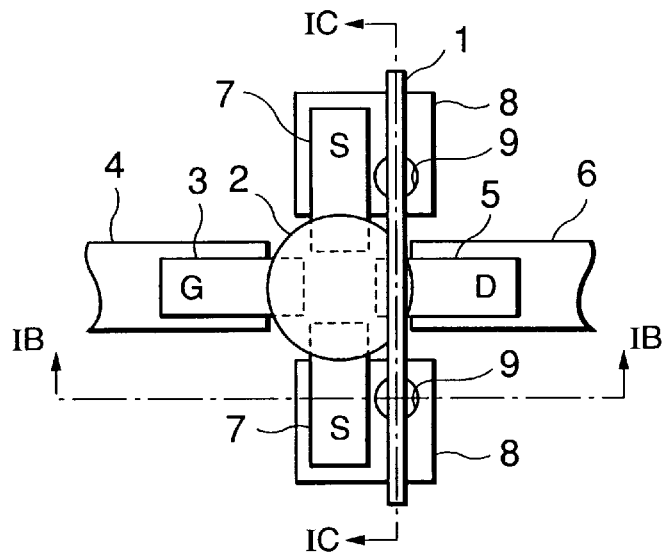
FIGS. 1A, 1B, and 1C are a plan view showing the basic structure of a semiconductor microwave amplifier according to the first embodiment of the present invention, a sectional view taken along a line IB—IB in the plan view, and a sectional view taken along a line IC—IC in the plan view, respectively.
Figure 1B:
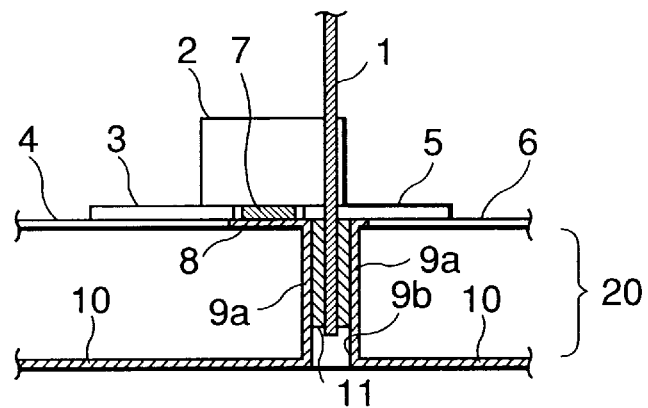
Figure 1C:
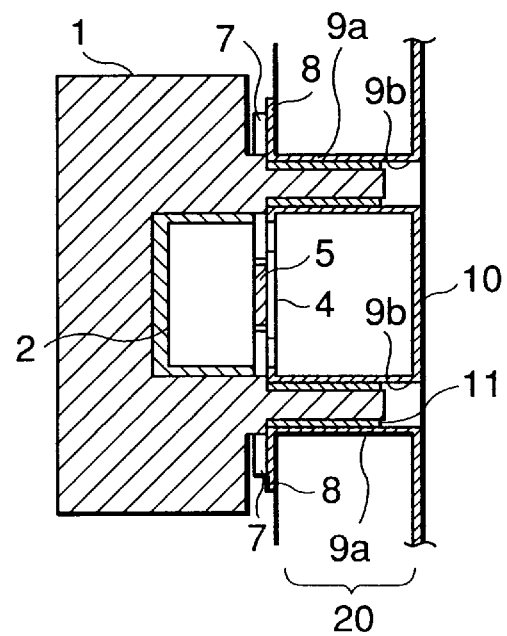

FIGS. 1A to 1C show the basic structure of a semiconductor microwave amplifier according to the first embodiment of the present invention. FIG. 1A is a plan view, FIG. 1B is a sectional side view taken along a line IB—IB in FIG. 1A, and FIG. 1C is a sectional side view taken along a line IC—IC.

In this semiconductor microwave amplifier, an input electrode 3 formed on an input-side microstrip line 4 to be parallel to the microstrip line 4, an output electrode 5 formed on an output-side microstrip line 6 to be parallel to the microstrip line 6 and opposing the input electrode 3, and a pair of ground electrodes 7 formed on ground lands 8 and extending to oppose each other in a direction perpendicular to the input and output electrodes are connected to a semiconductor amplification device 2 on a printed-circuit board 20. The semiconductor microwave amplifier also has a metal plate 1 connected to the ground electrodes 7 and serving as an electromagnetic connection shielding means for ensuring high-frequency isolation between the input electrode 3 and the output electrode 5 to shield the electromagnetic connection, and two through hole formation portions 9a formed in the printed-circuit board 20 and serving as a ground connection means connected to a ground surface 10 for the input-side microstrip line 4 and the output-side microstrip line 6.

The metal plate 1 has a portion serving as a flow prevention means which is inserted into a through hole 9b formed at the through hole formation portion 9a to prevent a solder 11 from flowing into the through hole 9b in reflow.

More specifically, in this semiconductor microwave amplifier, a microwave signal input from the input-side microstrip line 4 passes through the input electrode 3 of the semiconductor amplification device 2 and is amplified by the semiconductor amplification device 2, and then output to the output-side microstrip line 6 through the output electrode 5 of the semiconductor amplification device 2. The ground electrodes 7 of the semiconductor amplification device 2 are connected to the ground lands 8. The ground lands 8 are connected to the ground surface 10 of the output-side microstrip line 6 through the through hole formation portions 9a. The metal plate 1 separates the input electrode 3 from the output electrode 5 and is partially inserted into the through hole 9b, so the metal plate 1 is grounded and fixed by the solder 11. Before reflow, the solder 11 is applied to the surfaces of the ground lands 8. The ground electrodes 7 and the ground lands 8 are simultaneously fixed upon reflowing the solder 11.

As the size of through hole 9b becomes larger, and the number of through holes becomes larger, the impedance can be lowered. The minimum inner diameter of the through hole 9b must be e.g., 0.7 mm or more. The through hole 9b and the ground electrode 7 are preferably close to each other. If possible, the through hole 9b preferably contacts the ground electrode 7 or is partially formed under the ground electrode 7. In addition, the through hole 9b is preferably formed close to the semiconductor amplification device 2. These conditions are necessary to lower the ground impedance viewed from the semiconductor amplification device 2.

As the metal plate 1, a conductive material which can be satisfactorily soldered is preferably used. More specifically, a solder-plated copper plate is suitable. When the metal plate 1 is brought into contact with the side wall of a metal container in which the semiconductor amplification circuit is electromagnetically sealed, the isolation effect can be further increased.

In the above-described first embodiment, the metal plate 1 is arranged on the output electrode 5 side. However, the metal plate 1 may be placed on the input electrode 3 side.

Figure 2A:
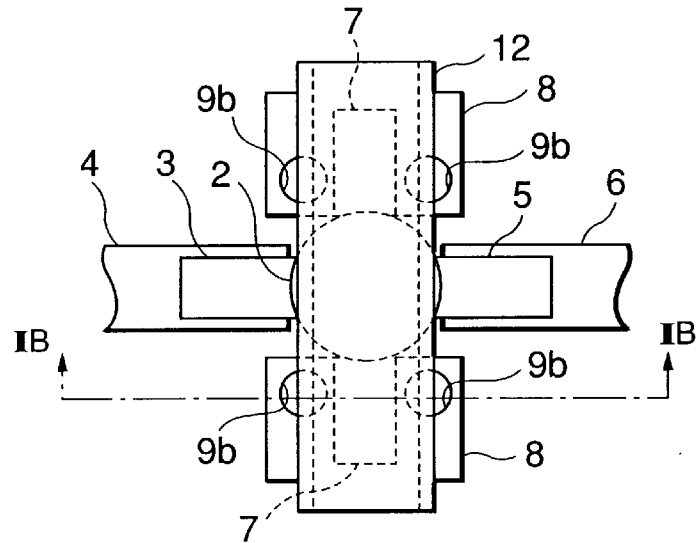
FIGS. 2A and 2B are a plan view showing the basic structure of a semiconductor microwave amplifier according to the second embodiment of the present invention and a sectional view taken along a line IIB—IIB in the plan view.
Figure 2B:
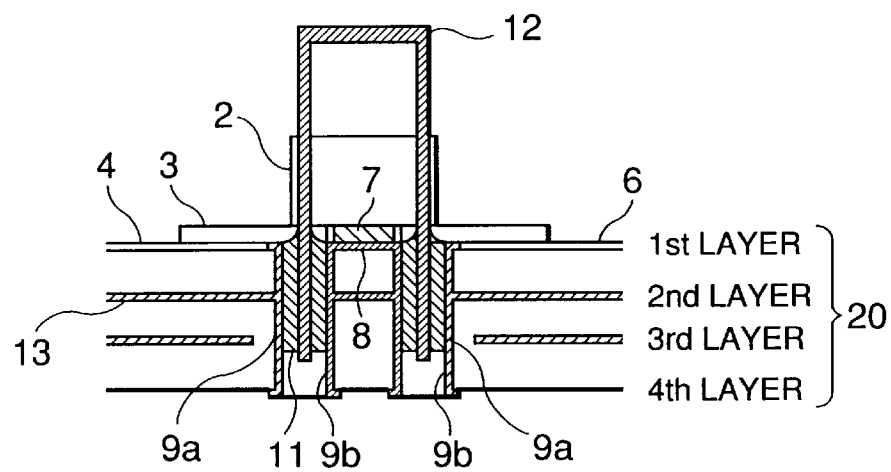

FIGS. 2A and 2B show the basic structure of a semiconductor microwave amplifier according to the second embodiment of the present invention. FIG. 2A is a plan view, and FIG. 2B is a sectional side view taken along a line IIB—IIB in FIG. 2A.

In this semiconductor microwave amplifier, an inverted U-shaped metal plate 12 formed by sheet metal working to have a flat surface is used in place of the metal plate 1, so chucking by the nozzle of an automatic mounting machine is allowed, unlike the first embodiment. More specifically, the inverted U-shaped metal plate 12 includes a portion serving as a target chuck means in mounting using an automatic mounting machine. For this reason, chucking by the nozzle of the automatic mounting machine is allowed to improve the attaching properties.

In this semiconductor microwave amplifier, an internal layer ground surface 13 for an input-side microstrip line 4 and an output-side microstrip line 6 is formed using an internal surface of a multilayered (in this case, four-layer) printed-circuit board 20, thereby ensuring high-frequency isolation from the lower surface of the printed-circuit board 20. Therefore, another circuit can be arranged on the lower surface of the printed-circuit board 20, so the number of components mounted per unit area can be increased.

In addition, this semiconductor microwave amplifier has four through holes 9b. With this structure, the connection impedance between a ground electrode 7 and the internal layer ground surface 13 for the input-side microstrip line 4 and the output-side microstrip line 6 can be lowered.

Note that the portion of the inverted U-shaped metal plate 12, which serves as a target chuck means in mounting using the automatic mounting machine, may also be formed on the metal plate 1 of the first embodiment.

As is apparent from the above description, the semiconductor microwave amplifier of the present invention is characterized by comprising a metal plate serving as an electromagnetic connection shielding means for shielding the electromagnetic connection between the input electrode and the output electrode of the semiconductor amplification device, and a through hole formation portion serving as a connection means for connecting the ground portion of the semiconductor amplification device to the ground surface for the microstrip line formed on the printed-circuit board at a low impedance. The metal plate is connected to the ground electrode at a low impedance so as to shield an electromagnetic wave directly coupled between the input and output through the peripheral space of the semiconductor amplification device. This metal plate has a portion inserted into the through hole and serving as a flow prevention means for preventing a solder from flowing into the through hole in reflow, and a portion serving as a target chuck means to be chucked by an automatic mounting machine in mounting using the automatic mounting machine.

What is claimed is:

1. A semiconductor microwave amplifier comprising input- and output-side microstrip lines formed on a printed-circuit board to oppose each other, input and output electrodes formed on said microstrip lines to be parallel to said microstrip lines, a pair of ground electrodes formed in a direction perpendicular to said input and output electrodes to oppose each other, and a semiconductor amplification device connected to all of said electrodes, comprising:

electromagnetic connection shielding means, connected to said ground electrodes, for ensuring high-frequency isolation between said input electrode and said output electrode to shield electromagnetic connection; and ground connection means for connecting a ground portion of said semiconductor device to a ground surface for said microstrip lines, said ground surface being formed on said printed-circuit board.

2. An amplifier according to claim 1, wherein said ground connection means has a through hole formation portion in said printed-circuit board.

3. A semiconductor microwave amplifier comprising input- and output-side microstrip lines formed on a printed-circuit board to oppose each other, input and output electrodes formed on said microstrip lines to be parallel to said microstrip lines, a pair of ground electrodes formed in a direction perpendicular to said input and output electrodes to oppose each other, and a semiconductor amplification device connected to all of said electrodes, comprising:

electromagnetic connection shielding means, connected to said ground electrodes, for ensuring high-frequency isolation between said input electrode and said output electrode to shield electromagnetic connection, said electromagnetic connection shielding means having a portion inserted into a through hole formed at the through hole formation portion of said printed-circuit board and serving as solder flow prevention means for preventing a solder from flowing into the through hole; and ground connection means for connecting a ground portion of said semiconductor device to a ground surface for said microstrip lines, said ground surface being formed on said printed-circuit board.

4. An amplifier according to claim 1, wherein said electromagnetic connection shielding means has a flat portion serving as target chuck means in mounting using an automatic mounting machine.

5. An amplifier according to claim 1, wherein said electromagnetic connection shielding means is arranged on a side of said output electrode.

6. An amplifier according to claim 1, wherein said electromagnetic connection shielding means is arranged on a side of said input electrode.

7. An amplifier according to claim 1, wherein said printed-circuit board has a multilayered structure and has an internal layer ground surface for said input- and output-side microstrip lines.

* * * * *